US007191426B1

(12) United States Patent
Singh et al.

(10) Patent No.: US 7,191,426 B1
(45) Date of Patent: Mar. 13, 2007

(54) METHOD AND APPARATUS FOR PERFORMING INCREMENTAL COMPILATION ON FIELD PROGRAMMABLE GATE ARRAYS

(75) Inventors: Deshanand Singh, Mississauga (CA); Stephen Brown, Toronto (CA); Kevin Chan, Scarborough (CA)

(73) Assignee: Altera Corporation, San Jose, CA (US)

( * ) Notice: Subject to any disclaimer, the term of this patent is extended or adjusted under 35 U.S.C. 154(b) by 253 days.

(21) Appl. No.: 10/931,953

(22) Filed: Sep. 1, 2004

(51) Int. Cl.
*G06F 17/50* (2006.01)
(52) U.S. Cl. .............................. 716/16; 716/5; 716/18; 716/10; 716/13
(58) Field of Classification Search ................. 716/16, 716/5, 18, 10, 13
See application file for complete search history.

(56) References Cited

U.S. PATENT DOCUMENTS

| 5,084,824 | A | * | 1/1992 | Lam et al. .................... 716/11 |
| 5,659,484 | A | * | 8/1997 | Bennett et al. ................ 716/16 |
| 5,867,396 | A | * | 2/1999 | Parlour ........................ 716/10 |
| 6,031,981 | A | * | 2/2000 | Lee et al. ..................... 716/10 |
| 6,035,106 | A | * | 3/2000 | Carruthers et al. ............ 703/1 |
| 6,167,558 | A | * | 12/2000 | Trimberger ................... 716/16 |
| 6,209,123 | B1 | * | 3/2001 | Maziasz et al. ............... 716/14 |
| 6,370,677 | B1 | * | 4/2002 | Carruthers et al. ............ 716/8 |
| 6,449,761 | B1 | * | 9/2002 | Greidinger et al. ........... 716/11 |
| 6,453,454 | B1 | * | 9/2002 | Lee et al. ..................... 716/11 |
| 6,530,073 | B2 | * | 3/2003 | Morgan ....................... 716/18 |
| 6,539,536 | B1 | * | 3/2003 | Singh et al. ................. 716/18 |
| 6,760,899 | B1 | * | 7/2004 | Young et al. ................. 716/16 |
| 6,779,169 | B1 | * | 8/2004 | Singh et al. ................. 716/16 |
| 6,910,200 | B1 | * | 6/2005 | Aubel et al. .................. 716/9 |
| 2001/0001881 | A1 | * | 5/2001 | Mohan et al. ................. 716/1 |
| 2002/0124234 | A1 | * | 9/2002 | Linz ............................ 716/18 |
| 2002/0129325 | A1 | * | 9/2002 | Tanaka ........................ 716/11 |
| 2002/0162086 | A1 | * | 10/2002 | Morgan ....................... 716/18 |
| 2002/0188918 | A1 | * | 12/2002 | Cirit ............................. 716/9 |
| 2003/0088842 | A1 | * | 5/2003 | Cirit ............................. 716/9 |
| 2003/0154458 | A1 | * | 8/2003 | Butts et al. .................. 716/17 |
| 2004/0088671 | A1 | * | 5/2004 | Wu et al. ..................... 716/16 |
| 2004/0199880 | A1 | * | 10/2004 | Kresh et al. .................. 716/4 |

(Continued)

FOREIGN PATENT DOCUMENTS

JP 09074138 A * 3/1997

(Continued)

OTHER PUBLICATIONS

Sing et al., "Incremental Placement for Layout-Driven Optimization on FPGAs", IEEE/ACM International Conference on Computer Aided Design, Nov. 10-14, 2002, pp. 752-759.*

(Continued)

*Primary Examiner*—Phallaka Kik
(74) *Attorney, Agent, or Firm*—L. Cho

(57) ABSTRACT

A method for designing a system on a target device utilizing field programmable gate arrays (FPGAs) includes generating a first design for the system that includes a first netlist describing a first logical design, and placement and routing of the first logical design. A second design for the system is generated that includes a second netlist describing a second logical design. Changes made to the first design in the second design are identified. Placement is performed on the changes made to the first design on the second design.

32 Claims, 11 Drawing Sheets

U.S. PATENT DOCUMENTS

2005/0091627 A1* 4/2005 Satapathy et al. ............ 716/12
2006/0048085 A1* 3/2006 Tyler et al. .................... 716/6

FOREIGN PATENT DOCUMENTS

JP 10283382 A * 10/1998

OTHER PUBLICATIONS

Raman et al., "A Timing-Constrained Incremental Routing Algorithm for Symmetrical FPGAs", Proceedings of European Design and Test Conference, Mar. 11-14, 1996, pp. 170-174.*

Togawa et al., "An Incremental Placement and Global Routing Algorithm for Field-Programmable Gate Arrays", Proceedings of the Asia and South Pacific Design Automation Conference, Feb. 10-13, 1998, pp. 519-526.*

Emmert et al., "Incremental Routing in FPGAs", Eleventh Annual IEEE International ASIC Conference, Sep. 13-16, 1998, pp. 217-221.*

Tessier, "Incremental Compilation for Logic Emulation", IEEE International Workshop on Rapid System Prototyping, Jul. 1999, pp. 236-241.*

Emmert et al., "On-Line Incremental Routing for Interconnect Fault Tolerance in FPGAs Minus the Router", Proceedings of 2001 IEEE International Symposium on Defect and Fault Tolerance in VLSI Systems, Oct. 24-26, 2001, pp. 149-157.*

Verma et al., "A Search-Based Bump-and-Refit Approach to Incremental Routing for ECO Applications in FPGAs", IEEE/ACM International Conference on Computer Aided Design, Oct. 4-8, 2001, pp. 144-151.*

Bian et al., "Local Logic Substitution Algorithm for Post-Layout Re-Synthesis", Proceedings of 5th International Conference on ASIC, Oct. 21-24, 2003, vol. 1, pp. 136-139.*

Kannan et al., "A Methodology and Algorithms for Post-Placement Delay Optimization", 31st Conference on Design Automation, Jun. 6-10, 1994, pp. 327-332.*

Suaris et al., "Smart Move: A Placement-Aware Retiming and Replication Method for Filed Programmable Gate Arrays", Proceedings of 5th International Conference on ASIC, vol. 1, Oct. 21-24, 2003, pp. 67-70.*

* cited by examiner

METHOD AND APPARATUS FOR PERFORMING INCREMENTAL COMPILATION ON FIELD PROGRAMMABLE GATE ARRAYS

FIELD OF THE INVENTION

The present invention relates to the field of field programmable gate arrays (FPGAs). More specifically, the present invention relates to a method and apparatus for performing incremental compilation on systems on FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs, and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

When modifications are made to a design of a system, current EDA tools require a re-work of the entire placement and routing procedures. This may require a significant amount of time. In situations when the modifications are minor, re-work of the entire placement and routing procedures is inefficient and undesirable and discourages designers from effectively carrying out the typical design flow which involves making small changes to a design and analyzing the effects of the changes.

Thus, what is needed is an efficient method and apparatus for performing incremental compilation on FPGAs.

SUMMARY

According to an embodiment of the present invention, a method and apparatus is disclosed to support incremental compilation of a new design utilizing placement and/or routing strategies generated from a previous design on an FPGA. Differences between two netlists are identified to determine which nodes are equivalent and which nodes are new or have changed since a last compilation. An initial placement is created by assigning locations to the nodes that are equivalent or similar. Any illegal placement of the nodes is corrected using an incremental placement procedure. Greedy optimization is further performed if necessary. Incremental routing of the placed design is performed where routing associated with equivalent nodes from the first netlist is preserved.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
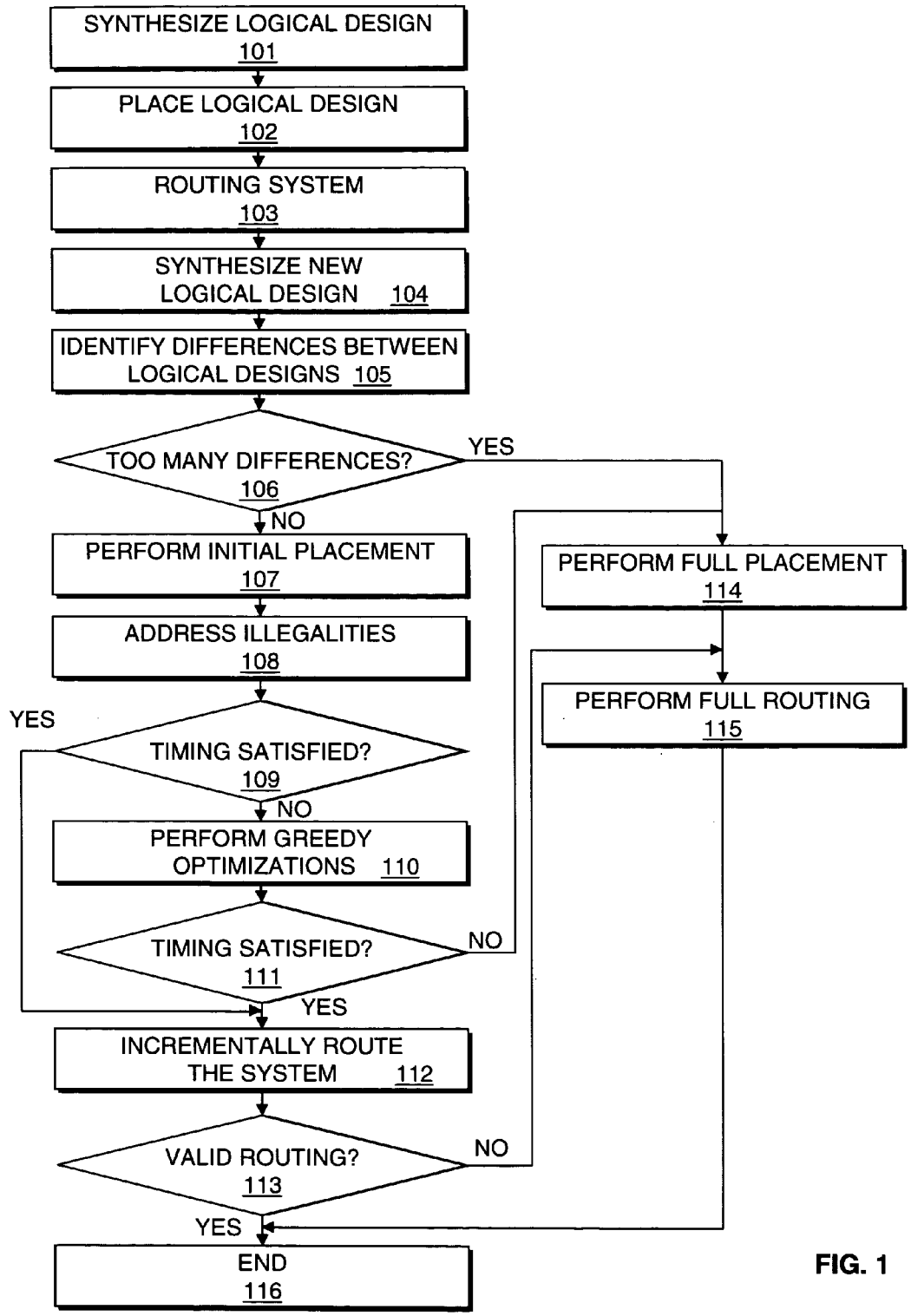
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay. Synthesis also includes mapping the optimized logic design. Mapping includes determining how to implement the logic components such as logic gates in the optimized logical representation with general resources available on the target device. According to an embodiment of the present invention, a netlist is generated from mapping. The netlist illustrates how the general resources available on the target device are utilized to implement the system. The netlist may, for example, include a representation of the resources on the target device as nodes and how the nodes are connected. The netlist may be an optimized technology-mapped netlist generated from the HDL.

Figure 2:
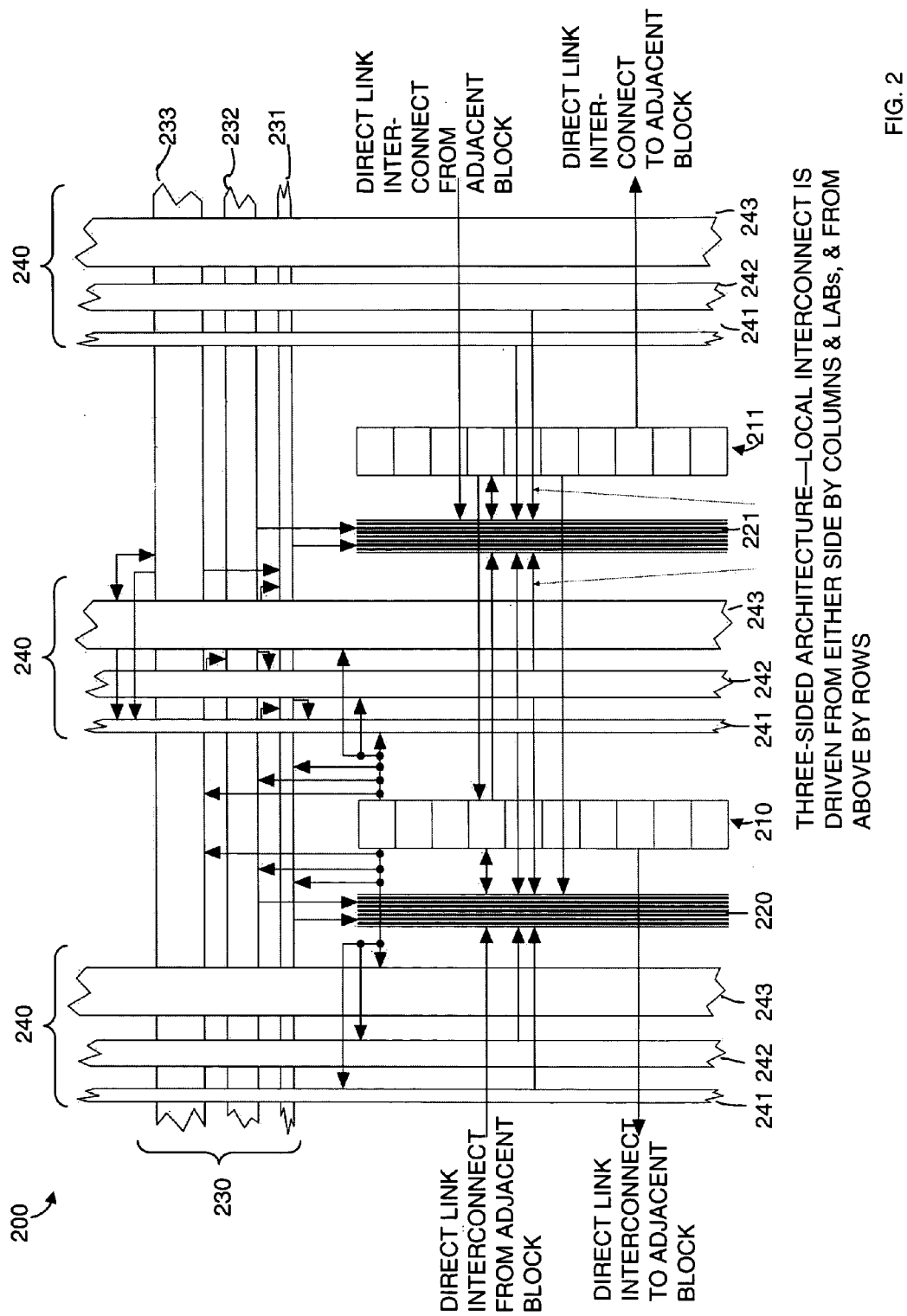
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220–221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220–221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include components other than those described in reference to the target device 200. Thus, while the invention described herein may be utilized on the architecture described in FIG. 2, it should be appreciated that it may also be utilized on different architectures, such as those employed by Altera® Corporation in its APEX™, Mercury™, Stratix™, and Stratix™ II family of chips and those employed by Xilinx®, Inc. in its Virtex™ and Virtex™ II line of chips.

Figure 3:
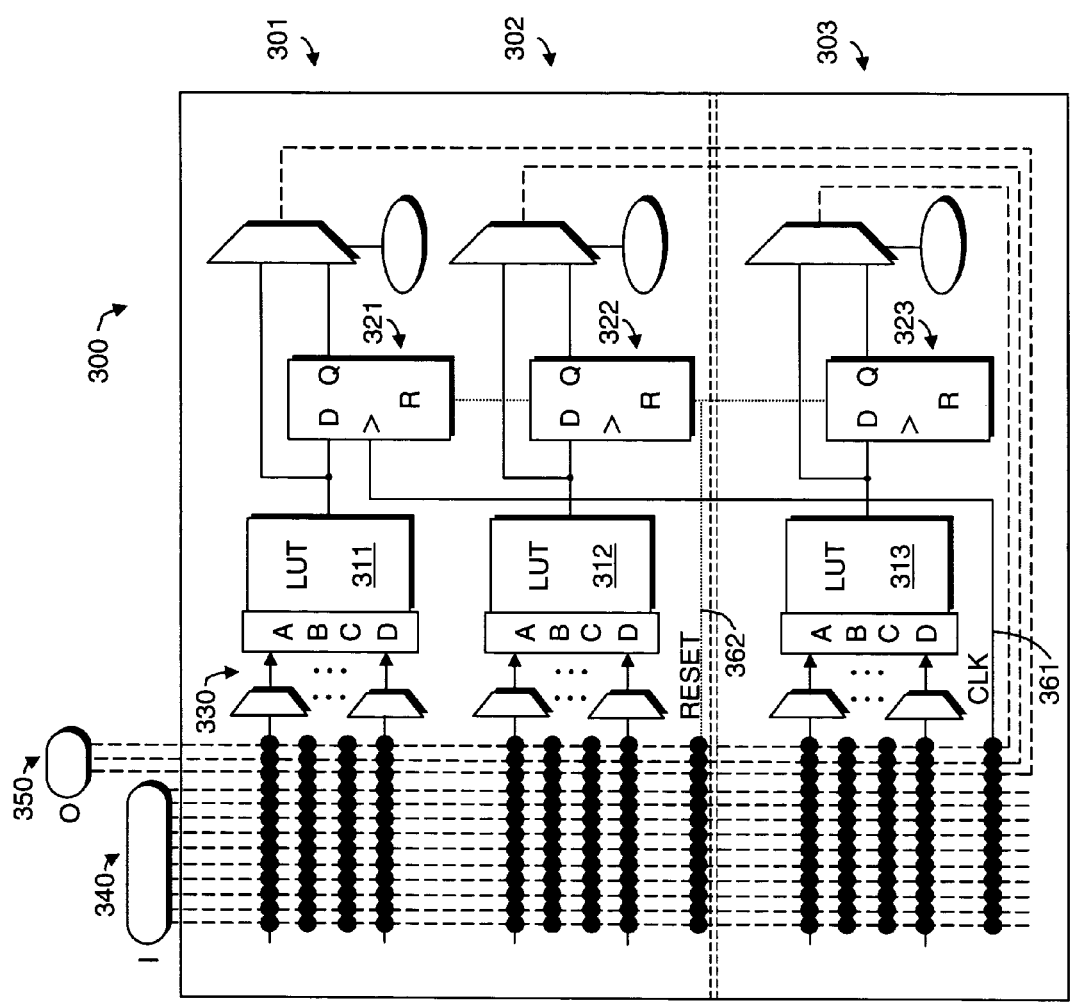
FIG. 3 illustrates a LAB according to an embodiment of the present invention.

FIG. 3 illustrates a LAB or clustered logic block 300 according to an embodiment of the present invention. The LAB 300 may be used to implement any of the LABs shown in FIG. 2. LEs 301–303 illustrates a first, second, and tenth LE in the LAB 300. The LEs 301–303 each have a 4-input lookup table 311–313, respectively, and a configurable register 321–323$s$, respectively, connected at its output. The LAB 300 includes a set of input pins 340 and a set of output pins 350 that connect to the general-purpose routing fabric so that LAB can communicate with other LABs. The inputs to lookup tables 311–313 can connect to any one of the input pins 340 and output pins 350 using the appropriate configuration bits for each of the multiplexers 330. The number of LEs, $n_E$, input pins, $n_I$, and output pins, $n_O$ in a LAB impose important architectural constraints on a system. In addition, since a single clock line 361 and a single asynchronous set/reset line 362 is attached to each configurable register 321–323, the configurable registers 321–323 must be clocked by the same signal and initialized by the same signal. The number of clock lines available in a LAB is represented by $n_C$. The number of reset lines available in a LAB is represented by $n_R$.

At 102, the mapped logical system design is placed. Placement works on the optimized technology-mapped netlist to produce a placement for each of the logic components. According to an embodiment of the present invention, placement includes fitting the system on the target device by determining the specific resources on the target device to be used for implementing the general resources mapped for logic components at 101. The placement procedure may be performed by a placer in an EDA tool that utilizes placement algorithms. According to an embodiment of the present invention, a user (designer) may provide input to the placer by specifying placement constraints.

At 103, routing of the system is performed. During routing, routing resources on the target device are allocated to provide interconnections between logic gates, logic elements, and other components on the target device. The routing procedure may be performed by a router in an EDA tool that utilizes routing algorithms.

At 104, synthesis is performed to generate a new logic design of the system to be implemented by the target device. According to an embodiment of the present invention, a new netlist is generated for the new logic design. In one embodiment, the synthesis is performed in response to layout-driven optimizations. The layout-driven optimizations may be generated by using routing delays for connections on the netlist that are estimated by calculating a fastest possible route. Timing-driven netlist optimization techniques may be applied to perturb the first netlist generated at 101 to reduce the critical path(s). The first netlist may be perturbed by an EDA tool, a user of the EDA tool, or by a third party. Perturbing the netlist may include adding, deleting, or moving components. According to an embodiment of the present invention, preferred locations are identified for the components that have been added or moved from the layout-driven optimization. The locations assigned to components of the existing system from the placement procedure are identified as preferred locations for the components.

At 105, differences between the logic designs are identified. According to an embodiment of the present invention, a netlist generated during synthesis at 101 (first netlist) is compared with a netlist generated at 104 (second netlist). The comparison may be used to determine changes with regard to addition of (new) nodes in the second netlist, deletion of (old) nodes in the first netlist, or movement of (old) nodes in the second netlist. According to one embodiment, a cost function is used to determine the likelihood that a first node synthesized in the first netlist is equivalent to a second node synthesized in the second netlist. If this probability exceeds a first threshold value, the two nodes are considered equivalent.

According to an embodiment of the present invention, the cost function may be based on timing and/or placement constraints. If the first and second nodes have similar timing and/or placement constraints, such as for example maximum operating frequency restrictions on the node's connections or boundary restrictions for the node's placement, the cost function may indicate that there is a high probability that the first and second nodes are equivalent.

According to an embodiment of the present invention, the cost function may be based on the number and/or the identity of the input connections (fanins) of a node. If the first and second nodes are driven by a same number of nodes or nodes that have been identified as being equivalent, the cost function may indicate that there is a high probability that the first and second nodes are equivalent.

According to an embodiment of the present invention, the cost function may be based on the number and/or the identity of the output connections (fanouts) of a node. If the first and second nodes drive a same number of nodes or nodes that have been identified as being equivalent, the cost function may indicate that there is a high probability that the first and second nodes are equivalent.

According to an embodiment of the present invention, the cost function may be based on a bit string (LUT mask) that effectively represents the truth table for a function being implemented by the node. If the first and second nodes have the same LUT mask, the cost function may indicate that there is a high probability that the first and second nodes are equivalent.

According to an embodiment of the present invention, the cost function may be based on the identity of neighboring nodes (siblings) of a node. If the first and second nodes are surrounded by siblings that are equivalent, the cost function may indicate that there is a high probability that the first and second nodes are equivalent.

According to an embodiment of the present invention, the cost function may be based on the resource type of the node. A resource type may be a category of resource such as logic element, pin, memory block, or other type of resource. If the first and second nodes are of the same resource type, the cost function may indicate that there is a probability that the first and second nodes are equivalent.

According to an embodiment of the present invention, the cost function may be based on the synthesized name of a node. If the first and second nodes have the same or similar name, the cost function may indicate that there is a high probability that the first and second nodes are equivalent.

It should be appreciated that one or more of the parameters described may be utilized by the cost function to determine equivalence and that other criteria may also be used. According to an embodiment of the present invention, a match between the first and second nodes with respect to one of the parameters may not guarantee a determination of equivalence. Similarly, a cost function may determine that a first and a second node are equivalent regardless of whether there are differences with respect to one of the parameters, According to an embodiment of the present invention, a set of equivalent nodes that exist in both the first and second netlist and a set of new nodes which may be new to the first netlist or moved from the first netlist are identified.

At 106, it is determined whether the number of differences between the first and second netlists exceeds a second threshold value. According to an embodiment of the present invention, the number of differences between the first and second netlists may be measured by the number of nodes in the second netlist that are not equivalent to nodes in the first netlist. If it is determined that the number of differences between the first and second netlists do not exceed the second threshold value, control proceeds to 107. If it is determined that the number of differences between the first and second netlists exceed the second threshold value, control proceeds to 114.

At 107, initial placement is performed. According to an embodiment of the present invention, initial placement is performed by attempting to put all the nodes in the second netlist at an optimal or preferred location without considering the legality or illegality of the placement. This would allow for nodes to be placed in same location as another nodes. Nodes in the second netlist that are determined to be equivalent to nodes in the first netlist are placed at the previous locations assigned to the nodes at 102.

Nodes in the second netlist that are not determined to have equivalent nodes in the first netlist have initial locations assigned. According to an embodiment of the present invention, assignment of initial locations may be achieved by considering locations of inputs and outputs of a node and placing the node in a location relatively central to the inputs and outputs. According to an alternate embodiment of the present invention, timing analysis information from a previous compile that may have been performed during procedures 101–103 or timing analysis information from a timing analysis performed during a different procedure may be utilized to product an optimal placement that considers the most critical path associated with the node. In one embodiment, the node may be placed at one of its inputs or outputs along the most critical path. The placement of the nodes may involve assigning initial locations that are not legal.

At 108, illegalities in placement are addressed. According to an embodiment of the present invention, an incremental placement procedure is performed in order to resolve any illegalities of placement generated from 107. Incremental placement involves evaluating resources on a target device such as LABs that have architectural violations or illegalities from initial placement. Incremental placement attempts to perturb the preferred locations as little as possible to ensure that the final placement respects all architectural constraints. Incremental placement attempts to identify non-critical LEs that may be moved from their preferred locations to resolve architectural violations in order that truly critical elements may stay at their preferred locations. Incremental placement may be performed by an incremental placement engine (not shown) in the EDA tool that utilizes incremental placement algorithms.

In performing incremental placement, an architectural description of the target device, A, and a netlist, N(E,C), that includes a set of logic elements, E, and a set of connections, C, is processed. Each element, e, is associated with a preferred physical location, $(p_x(e), p_y(e))$. According to an embodiment of the present invention, all atoms of the netlist have a preferred location. Incremental placement generates a set of mapped locations, M, for each logic elements in N. Incremental placement tries to find a mapping from preferred locations to mapped locations, P→M, such that the mapped locations are architecturally feasible as well as being minimally disruptive. The definition of minimal disruption depends on the goal of netlist optimization.

According to an embodiment of the present invention, the goal of netlist optimization is to optimize timing of the system. In this embodiment, T(S) represents an estimate of the critical path delay if all logic elements in E are mapped to $(s_x(e), s_y(e))$. The estimate may ignore the legality of locations and may be computed assuming a best case route is possible for each connection. In this example, P→M is minimally disruptive if incremental placement minimizes {T(M)−T(P)}. Any logic element can be moved from its preferred location as long as it does not degrade the critical path. According to one embodiment, routing area is also tracked to control excessive routing congestion. In this embodiment, A(S) represents the routing area consumed if the logic elements are mapped to $(s_x(e), s_y(e))$. Minimal disruptiveness is satisfied by minimizing the relationships shown below.

{T(M)−T(P)}+{A(M)−A(P)}  (1)

Figure 4:
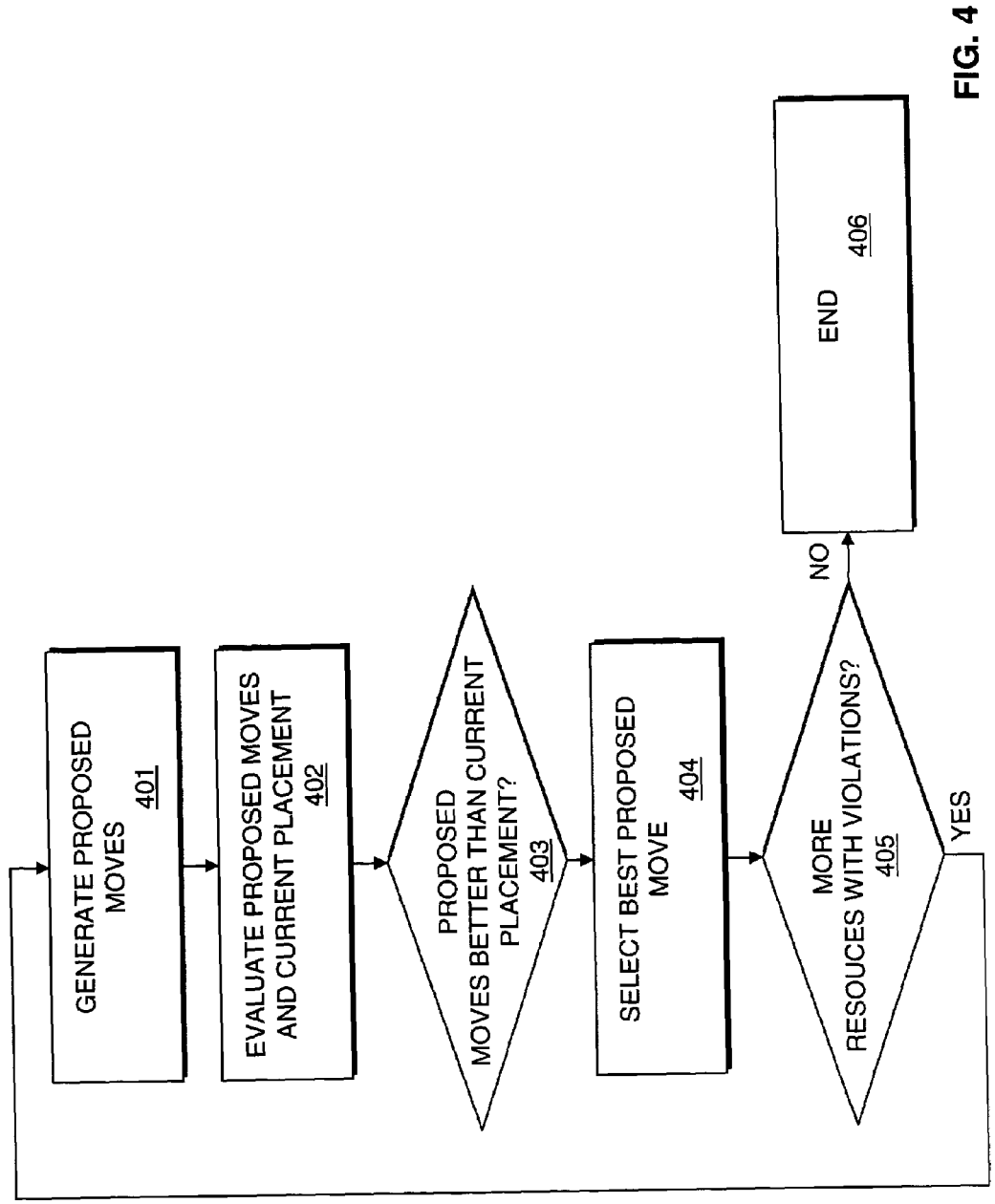
FIG. 4 is a flow chart illustrating a method for performing incremental placement according to an embodiment of the present invention.

FIG. 4 is a flow chart illustrating a method for performing incremental placement according to an embodiment of the present invention. The method described in FIG. 4 may be used to perform incremental placement as shown as 105 in FIG. 1. At 401 proposed moves for all LEs in a LAB having architectural violations are generated. According to an embodiment of the present invention, proposed moves may include a move-to-fanin, move-to-fanout, move-to-sibling, move-to-neighbor, move-to-space, a move towards a critical vector, and other moves. A move-to-fanin involves moving an LE to a LAB that is a fanin of the LE. A move-to-fanout involves moving an LE to a LAB that is a fanout of the LE. A move-to-sibling involves moving an LE to a LAB that is fanout of a LAB that fans in to the LAB of the LE.

Figure 5:
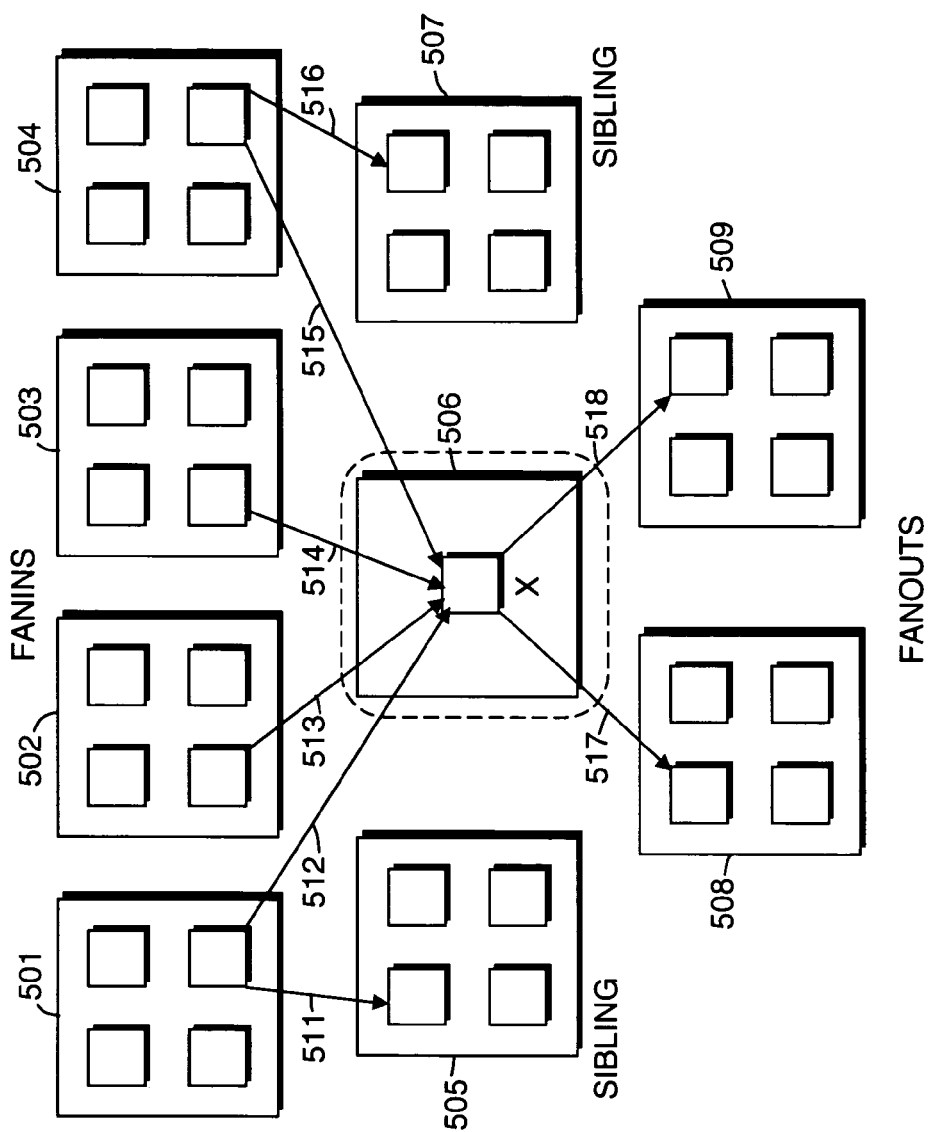
FIG. 5 illustrates fanin, fanout, and sibling relationship move proposals according to an embodiment of the present invention.

FIG. 5 illustrates examples of a move-to-fanin, move-to-fanout, and move-to-sibling. When a first LE in a first LAB transmits a signal to a second LE in a second LAB, the first LAB is said to be a fanin of the second LE. When a first LE in a first LAB receives a signal from a second LE in a second LAB, the first LAB is said to be a fanout of the second LE. When a first LE from a first LAB receives a signal from a second LE from a second LAB that also transmits to a third LE in a third LAB, the first LAB and the third LABs are said to be siblings. Blocks 501–509 illustrate a plurality of LABs. Each of the LABs 501–509 has a number of shown LEs. A plurality of arrows 511–518 are shown to illustrate the direction of a signal transmitted between LEs. Relative to LAB 506, LABs 501–504 are considered fanins, LABs 505 and 507 are considered siblings, and LABs 508 and 509 are considered fanouts.

Figure 6:
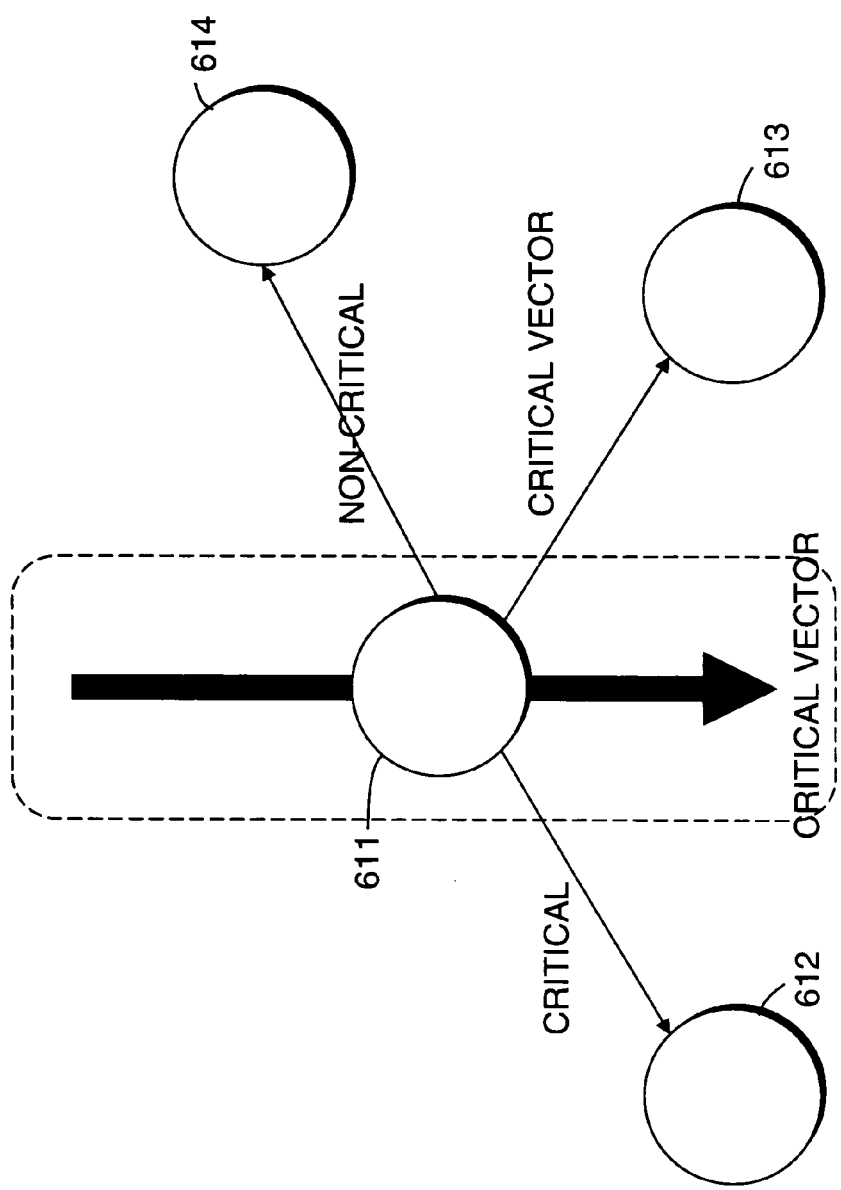
FIG. 6 illustrates an exemplary critical vector move proposal according to an embodiment of the present invention.

Proposed moves may also include move-to-neighbor, move-to-space, and move towards critical vector. A move-to-neighbor involves moving an LE to an adjacent LAB. A move-to-space involves a move to any random free LE location in a target device. A move towards critical vector involves moving an LE towards a vector that is computed by summing the directions of all critical connections associated with the moving LE. FIG. 6 illustrates an exemplary critical vector 601. Vector 601 is the critical vector of LE 611 which has critical connections to LEs 612 and 613, and a non-critical connection with LE 614.

Referring back to FIG. 4, at 402, a current placement of LEs in a LAB with architectural violations and proposed moves of the LEs in the LAB are evaluated by a cost function. The cost function may include parameters which measure the legality of a LAB (cluster legality cost), timing (timing cost), and an amount of routing resources that is required for a placement (wirelength cost). According to an embodiment of the present invention, the cost function guides the reduction of architectural violations while ensuring minimal disruption. This cost function, C, is illustrated with the relationship shown below.

$C = K_L*\text{ClusterCost} + K_T*\text{TimingCost}*K_W*\text{WirelengthCost}$  (2)

$K_L$, $K_T$, and $K_W$ represent weighting coefficients that normalize the contributions of each parameter. It should be appreciated that other parameters may be used in addition to or in place of the parameters described.

The cluster legality cost is a cost associated with each LAB $CL_i$. This cost may be represented as shown below.

$\text{ClusterCost}(CL_i) = kE_i*\text{legality}(CL_i, n_E) +$ $KI_i*\text{legality}(CL_i, n_I) +$ $kR_i*\text{legality}(CL_i, n_R) +$ $kO_i*\text{legality}(CL_i, n_O) +$ $kC_i*\text{legality}(CL_i, n_C)$  (3)

The legality $(CL_i, \ldots)$ function returns a measure of legality for a particular constraint. A value of 0 indicates legality, while any positive value is proportional to the amount to which the constraint has been violated. Functions legality $(CL_i, n_E)$, legality $(CL_i, n_I)$, legality $(CL_i, n_O)$, legality $(CL_i, n_R)$, and legality $(CL_i, n_C)$ evaluate if LAB $CL_i$ has a feasible number of logic elements, inputs, outputs, reset lines and clock lines, respectively. According to an embodiment of the present invention, the weighting coefficients $kE_i$, $KI_i$, $kO_i$, $kR_i$, and $kC_I$ are all initially set to 1 for every LAB $CL_i$ in the target device.

The timing cost associated with a placement may be represented as shown below.

$\text{TimingCost} = TC_{VPR} + k_{DAMP}*TC_{DAMP}$  (4)

The first parameter, $TC_{VPR}$, is based upon the cost used by a versatile placement and routing (VPR) placer. This cost may be represented with the following relationship.

$TC_{VPR} = \Sigma_C \text{crit}(c)*\text{delay}(c)$  (5)

This function encourages critical connections to reduce delay while allowing non-critical connections to optimize wirelength and other optimization criteria.

The second parameter, $TC_{DAMP}$, operates as a damping component of the timing cost function and can be represented with the following relationships.

$TC_{DAMP} = \Sigma_C \max(\text{delay}(c) - \text{maxdelay}(c), 0.0)$  (6)

$\text{maxdelay}(c) = \text{delay}(c) + \alpha*\text{slack}(c)$  (7)

The damping component penalizes any connection c whose delay(c) exceeds a maximum value maxdelay(c). This allows arbitrary moves to be made along a plateau defined by the maximum delays. The maxdelay values may be updated every time a timing analysis of the system is executed. The maxdelay values are controlled by the slack on the connection considered. The parameter $\alpha$ determines how much of a connection's slack will be allocated to the delay growth of the connection. Thus, the plateau is defined by the connection slack so that connection with large amounts of slack are free to move large distances in order to resolve architectural violations, while small slack values are relatively confined.

Figure 7:
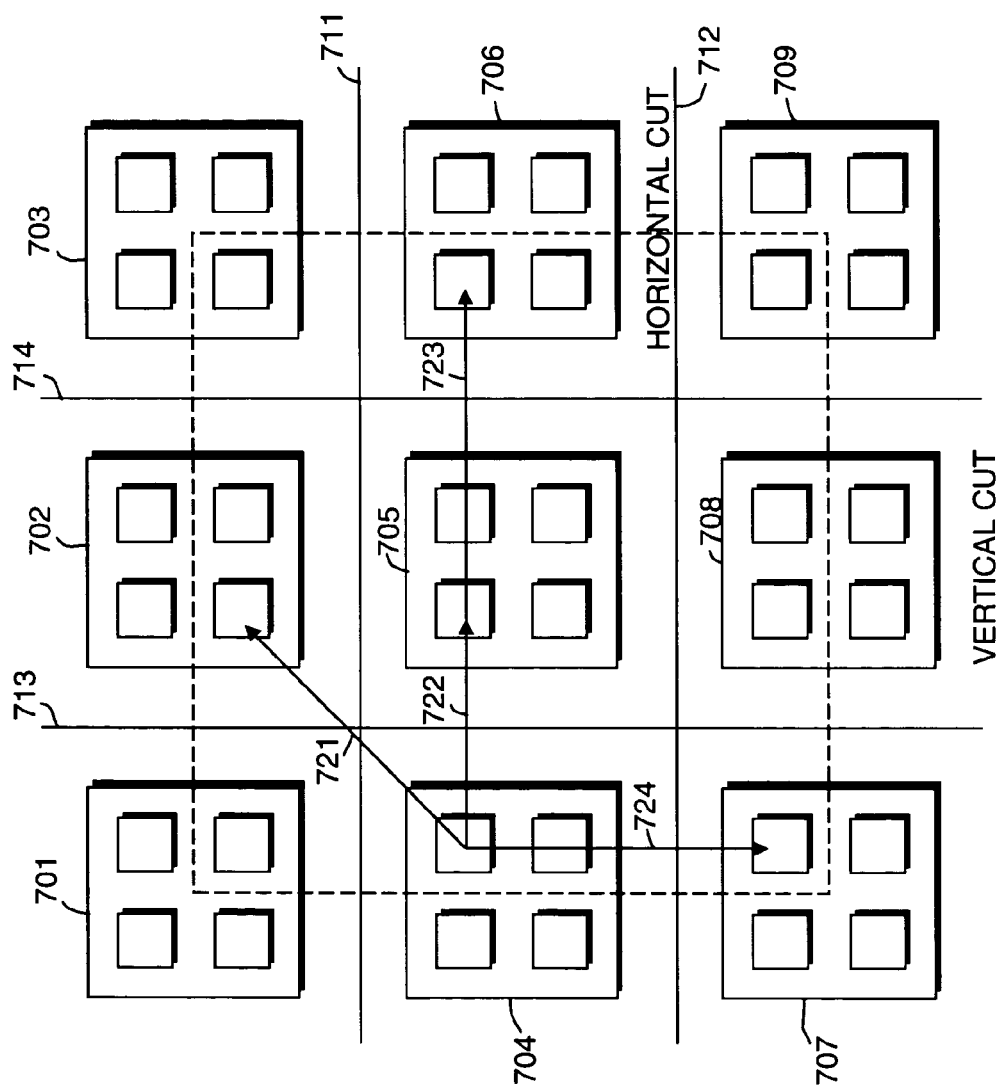
FIG. 7 illustrates horizontal and vertical cut-lines used for local congestion estimation according to an embodiment of the present invention.

Wirelength cost of a placement may be measured by determining a number of routing wires that cross cut-lines that outline a LAB. FIG. 7 illustrates the utilization of cut-lines according to an embodiment of the present invention. Blocks 701–709 represent LABs having a plurality of shown LEs. Horizontal cut-lines 711 and 712 and vertical cut-lines 713 and 714 are placed in each horizontal channel of a target device. Cut-lines provide a method to measure congestion by finding the regions that have the largest number of routing wires 721–724. This measurement may be used to prevent the formation of localized congested areas that can cause circuitous routes. The total number of routing wires that intersect a particular cut may be calculated by finding all the signals that intersect a particular cut-line and summing the average crossing-count for each of these signal wires. The average crossing count for a signal may be computed using the following relationship.

$$CrossingCount(net)=q(NumCLBlockPins(net)) \qquad (8)$$

The function q is given as a number of discrete crossing counts as a function of signal pin count. The argument to the function q is the number of clustered logic block pins used to wire the signal. With respect to the functions shown in (3)–(8), it should be appreciated that other types of functions may be used in addition or in place of the functions represented.

Referring back to FIG. 4, at 403, it is determined whether the cost associated with any of the proposed moves is better than the cost associated with the current placement. The costs associated with the proposed moves and current placement may be obtained by using cost function values generated from using the cost function described with respect to 402. If it is determined that the cost associated with any of the proposed moves is better than the cost associated with the current placement, control proceeds to 404. If it is determined that the cost associated with any of the proposed moves is not better than the cost associated with the current placement, control proceeds to 405.

At 404, the proposed move associated with the best cost is selected as the current placement.

At 405, it is determined whether any additional LABs in the system have architectural violations. If additional LABs in the system have architectural violations, control will move to one of these LABs and proceeds to 401. If no additional LABs in the system have architectural violations, control proceeds to 406 and terminates the procedure. According to an embodiment of the present invention, a counter may be used to track the number of proposed moves that have been generated, or the number of LEs or LABs that have had proposed moves generated. In this embodiment, when this number exceeds a threshold value, instead of proceeding to 401, control terminates the procedure and returns an indication that a fit was not found.

Figure 8:
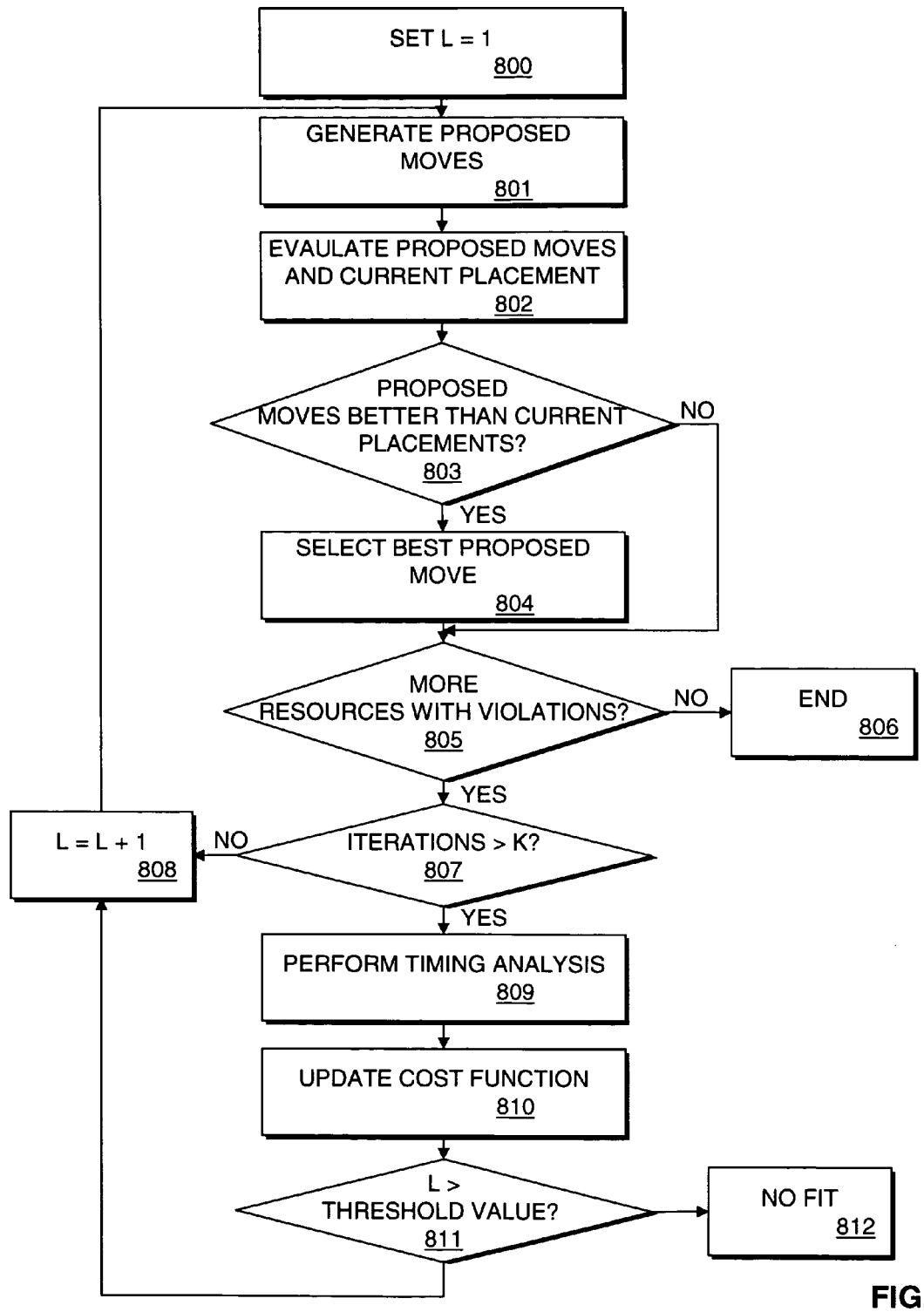
FIG. 8 is a flow chart illustrating a method for performing incremental placement utilizing directed hill-climbing according to an embodiment of the present invention.

FIG. 8 is a flow chart illustrating a method for performing incremental placement utilizing directed hill-climbing according to an embodiment of the present invention. The method described in FIG. 8 may be used to perform incremental placement as shown as 105 in FIG. 1. At 800, a loop iteration index, L, is set to 1.

At 801 proposed moves for all LEs in a LAB having architectural violations are generated. According to an embodiment of the present invention, the proposed moves may be generated similarly as described in 401 shown in FIG. 4. The number of LEs having proposed moves generated is recorded.

At 802, a current placement of LEs in a LAB with architectural violations and proposed moves of the LEs in the LAB are evaluated by a cost function. According to an embodiment of the present invention, the evaluation performed may be similarly conducted as described in 402 of FIG. 4.

At 803, it is determined whether the cost associated with any of the proposed moves is better than the cost associated with the current placement. The costs associated with the proposed moves and current placement may be obtained by using values generated from using the cost function described with respect to 402. If the cost associated with any of the proposed moves is better than the cost associated with the current placement, control proceeds to 804. If the cost associated with any of the proposed moves is not better than the cost associated with the current placement, control proceeds to 805.

At 804, the proposed move associated with the best cost is selected as the current placement.

At 805, it is determined whether any additional LABs in the system have architectural violations. If additional LABs in the system have architectural violations, control will move to one of these LABs and proceeds to 807. If no additional LABs in the system have architectural violations, control proceeds to 806 and terminates the procedure.

At 807, it is determined whether the number of LEs that have proposed moves generated exceeds the value K where K is a predefined value. If the number of LEs that have proposed moves generated exceeds the value K, control proceeds to 809. If the number of LEs that have proposed moves generated does not exceed the value K, control proceeds to 808.

At 808, the loop iteration index, L, is incremented. Control returns to 801.

At 809, timing analysis is performed. According to an embodiment of the present invention, the values for maxdelay and crit(c), used for evaluating timing cost, are updated to reflect the current configuration of the system.

At 810, the cost function is updated. According to an embodiment of the present invention, weighting coefficients in the ClusterCost parameter are incremented in proportion to an amount of violation. Updating the cost function allows directed hill-climbing to be performed. Directed hill-climbing is a technique that is used for generating proposed moves when moves cannot be found to decreases the current cost of a placement.

Figure 9:
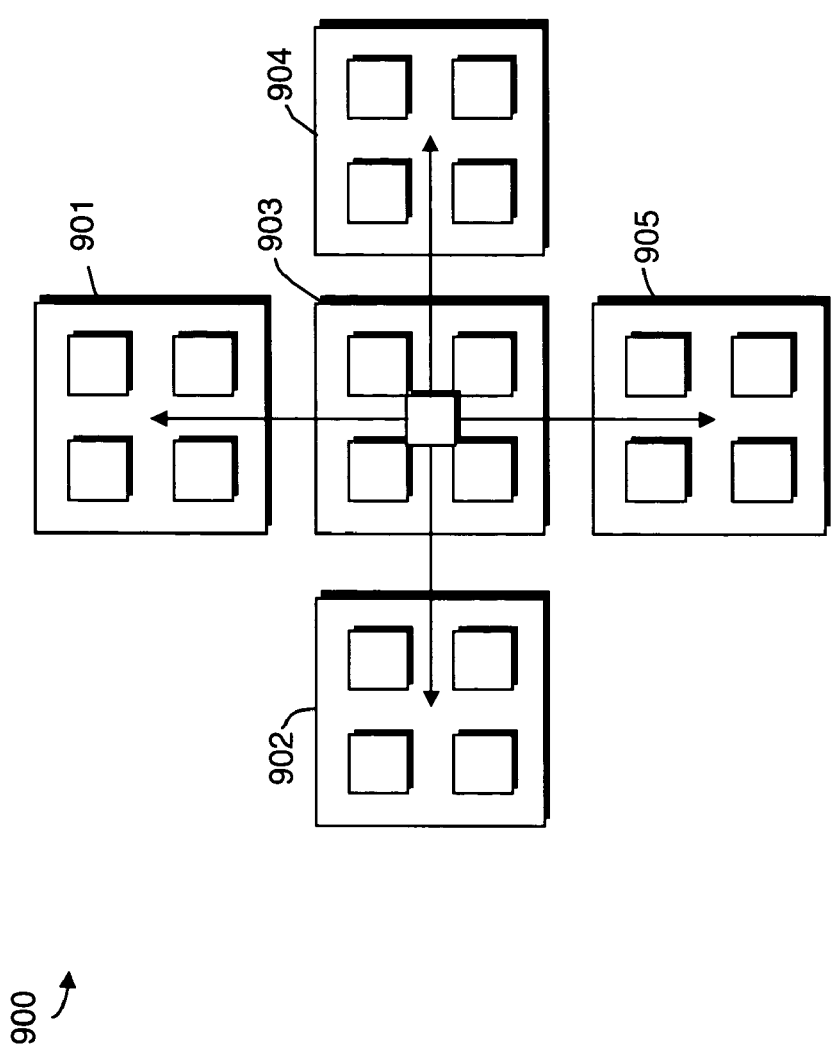
FIG. 9 illustrates a component trapped in a local minima according to an embodiment of the present invention.

FIG. 9 illustrates an example where directed hill-climbing may be applied. The target device 900 includes a plurality of LABs 901–905 each having a plurality of shown LEs. In this example, LAB 903 has one LE more than is allowed by its architectural specification. Every possible move attempt to resolve the architectural constraints of the center LAB 903 results in another architectural violation. If all architectural violations are costed in the same manner, then the method described in FIG. 4 may have difficulties resolving the constraint violation.

Figure 10:
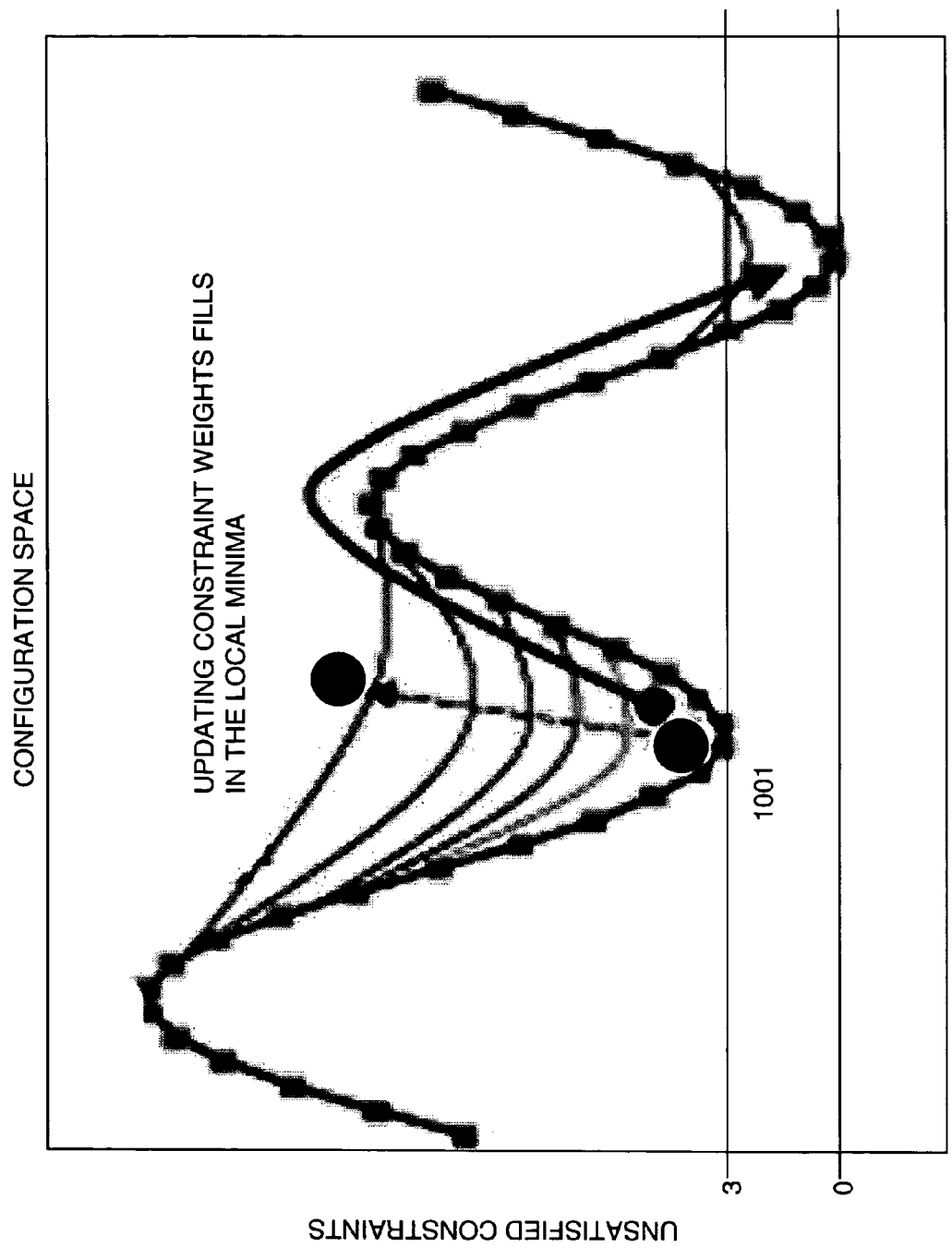
FIG. 10 illustrates basin-filling according to an embodiment of the present invention.

FIG. 10 illustrates a two dimensional slice of the multi-dimensional cost function described. The current state 1001 represents the situation shown in FIG. 9. No single move in the neighborhood of the current state finds a solution with a lower cost. However, the cost function itself could be modified to allow for the current state 1001 to climb the hill. The weighting coefficients of the cost function may be gradually increased for LABs that have unsatisfied constraints. A higher weight may be assigned to unsatisfied constraints that have been violated over a long period of time or over many iterations. This results in the cost function being reshaped to allow for hill climbing. The reshaping of the cost function has the effect of filling a basin where the local minima is trapped. Referring back to FIG. 9, once the weighting coefficients have been increased for LAB 903, a proposed move to one of the adjacent cluster may be made to allow for shifting the violation "outwards" to a free space.

Updating a cost function also allows for a quick convergence by preventing a phenomenon known as thrashing. Thrashing occurs when incremental placement is trapped in an endless cycle where an LE is moved between two points in the configuration space which both result in architectural violations. By increasing the cost or penalty for moving to the two points, a move to a third point would eventually be more desirable and accepted.

Referring back to FIG. 8, at 811, it is determined whether the loop index, L, is greater than a threshold value. If the loop index, L, is not greater than the threshold value, control proceeds to 808. If the loop index, L, is greater than the threshold value, control proceeds to 812.

At 812, control terminates the procedure and returns an indication that a fit was not found.

The incremental placement techniques disclosed allow logic changes to be incorporated into an existing system design without reworking placement of the entire system. The incremental placement techniques attempt to minimize disruption to the original placement and maintain the original timing characteristics. According to an embodiment of the present invention, a method for designing a system on a target device utilizing FPGAs is disclosed. The method includes placing new LEs at preferred locations on a layout of an existing system. Illegalities in placement of the components are resolved. According to one embodiment, resolving the illegalities in placement may be achieved by generating proposed moves for an LE, generating cost function values for a current placement of the LE and for placements associated with the proposed moves, and accepting a proposed move if its associated cost function value is better than the cost function value for the current placement.

Referring back to FIG. 1, it is determined whether the new locations for the nodes determined at 109 allow for the new design to satisfy timing constraints. According to an embodiment of the present invention, a timing analysis may be performed to make the determination. According to an alternate embodiment of the present invention, a timing analysis conducted during incremental placement at procedure 108 may be used to make the determination. If timing constraints are satisfied, control proceeds to 112. If timing constraints are not satisfied, control proceeds to 110.

At 110, greedy optimizations are performed. Greedy optimizations are performed to improve the placement of nodes made at 108 According to an embodiment of the present invention, this may be achieved by first swapping components assigned to be implemented by LABs on the target device (LAB swapping). Afterwards, components assigned to be implemented by LEs on the target device are swapped (LE swapping). A cost function may be used based on, but not limited to, wire length, criticality, power, or other metric. The procedure does not utilize hill-climbing. Thus, any move that improve the cost function is accepted. According to an embodiment of the present invention 110 may be performed before 108 and the procedures may be reversed.

At 111, it is determined whether the new locations for the nodes determined at 110 allow for the new design to satisfy timing constraints. According to an embodiment of the present invention, a timing analysis may be performed to make the determination. If timing constraints are satisfied, control proceeds to 112. If timing constraints are not satisfied, control proceeds to 114.

At 112, the system is incrementally routed. According to an embodiment of the present invention, routing resources that correspond to a node in the second netlist that is equivalent to a node in the first netlist are identified. If a routing resources has source and sink nodes that are also equivalent, the routing resources may be preserved for the node's use. The identified routing resources may be preserved for the node's use by using routing constraints.

Figure 11:
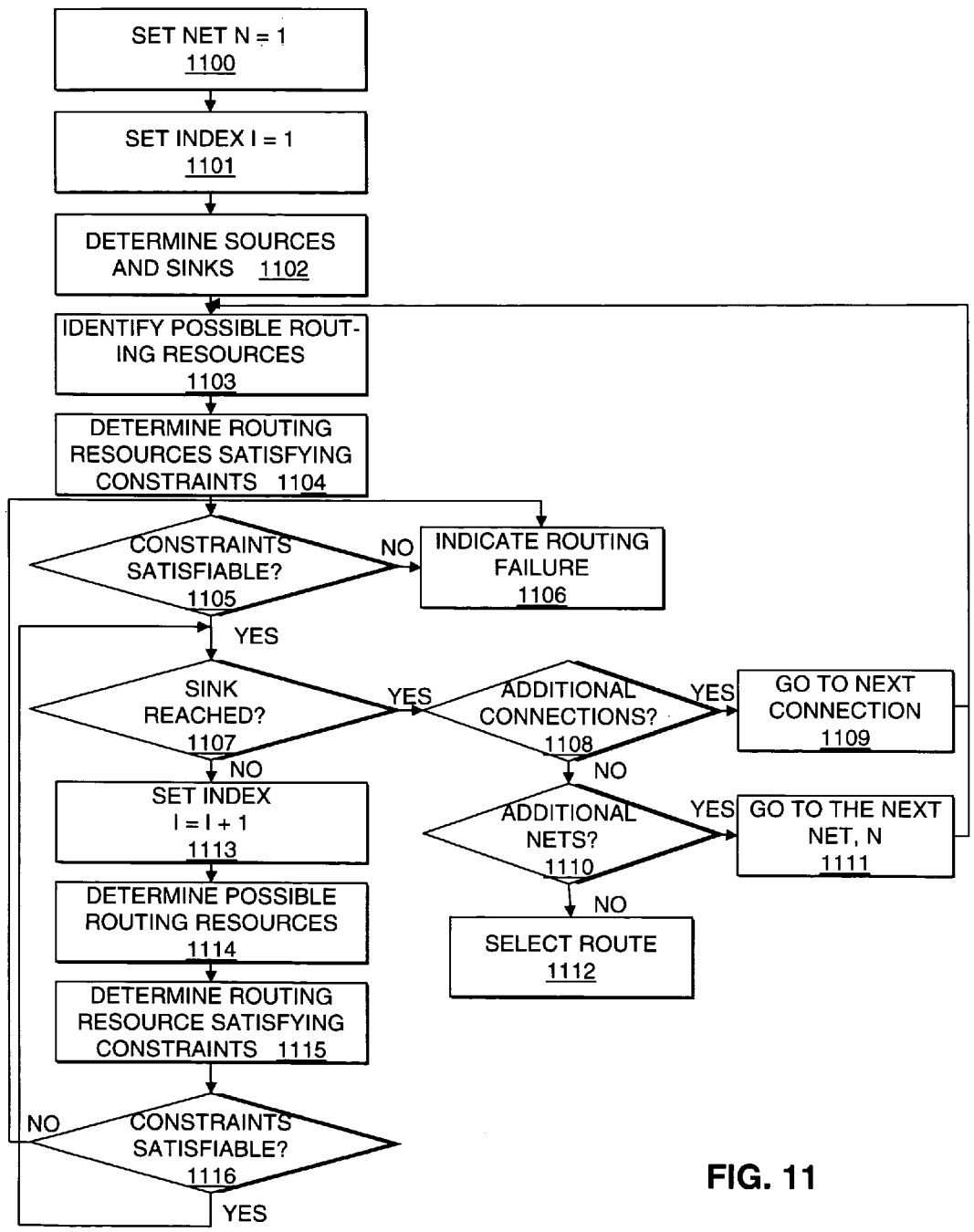
FIG. 11 illustrates a method for performing routing according to an embodiment of the present invention.

FIG. 11 is a flow chart illustrating a method for performing routing according to an embodiment of the present invention. The method described in FIG. 11 may be used to implement some of the procedures in 111 shown in FIG. 1. In this embodiment, the routing resources that are determined to be preserved are specified as routing constraints. At 1100, the net, n, is set to the first net, 1.

At 1101, index i is set to 1.

At 1102, the source and sinks are determined for net n. According to an embodiment of the present invention, a source represents a start point for a net or connection on the target device. A sink represents an end or destination point for a net or connection on the device.

At 1103, for the current connection on the current net, all possible routing resources that may be used to route from the source are identified. The identified routing resources may be included in a list referred to as "routing wires for segment i".

At 1104, the identified routing resources in the routing wires for segment i list that satisfy the routing constraints for the system are determined. The routing wires for segment i list is updated to include only the routing resources that satisfy the routing constraints. The routing resources in the routing wires for segment i list are potential segments on the connection.

At 1105, if none of the identified routing resources in the routing wires for segment i list satisfies the constraints for the system, control proceed to 1106. If at least one of the identified routing resources in the routing wires for segment i list satisfies the constraints for the system, control proceeds to 1107.

At 1106, an indication is generated that there is a routing failure. Alternatively, a procedure that updates the routing constraints to remove a constraint that could not be satisfied may be called. After updating the routing constraints, control would return to step 1101 to retry the routing. This provides flexibility to allow some of the preserved routing to be altered if necessary.

At 1107, it is determined whether a sink for the connection has been reached from each of the identified routing resources in the routing wires for segment i list. If a sink for the connection has been reached, control proceeds to 1108. If a sink for the connection has not been reached, control proceeds to 1113.

At 1108, it is determined whether additional connections are to be routed for the current net. If additional connections are to be routed, control proceeds to 1109. If additional connections are not to be routed, control proceeds to 1110.

At 1109, control prepares to route the next connection. Control proceeds to 1103.

At 1110, it is determined whether additional nets are to be routed. If additional nets are to be routed, control proceeds to 1111. If additional nets are not to be routed, control proceeds to 512.

At 1111, control goes to the source of the next net and prepares the route the first connection in the next net. Net n is set to n+1. Control proceeds to 1101.

At 1112, a route is selected for the connection. According to an embodiment of the present invention, if a plurality of routed paths that connect the source to the sink is available, the path that provides the shortest path, that utilizes routing resources having the smallest cost function value that yields the smallest delay, or that satisfies some other criteria is selected to be the routed path for the connection. If no routed path is available to select from, a routing failure is indicated.

At 1113, index i is set to i+1

At 1114, for the current identified routing resource in the connection, all possible routing resources that may be used to route from the identified routing resource are determined. The identified routing resources may be included in a list referred to as "routing wires for segment i".

At 1115, the identified routing resources in the routing wires list for segment i that satisfy the routing constraints for the system are determined. The routing wires list for segment i is updated to include only the routing resources that satisfy the routing constraints. The routing resources in the routing wires list for segment i are potential segments on the connection.

At 1116, if none of the identified routing resources in the routing wire list satisfies the constraints for the system, control proceed to 1106. If at least one of the identified routing resources in the routing wire list satisfies the constraints for the system, control proceeds to 1107.

Referring back to FIG. 1, at 113, it is determined whether valid routing has been achieved. If valid routing has been achieved, control proceeds to 116. If valid routing has not been achieved, control proceeds to 115.

At 114, full placement is performed. According to an embodiment of the present invention, full placement of the new design on the second netlist is performed. The full placement may be performed similarly to how the first netlist was placed at 102.

At 115, full routing is performed. According to an embodiment of the present invention, full routing of the new design on the second netlist is performed. The full routing may be performed similarly to how the first netlist was routed at 103.

FIGS. 1, 4, 8, and 11 are flow charts illustrating a method for designing a system on a PLD, and methods for performing incremental placement. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 4, and 5) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs) comprising:
   generating a first design for the system that includes a first netlist describing a first logical design, and placement and routing of the first logical design;
   generating a second design for the system that includes a second netlist describing a second logical design;
   identifying changes made to the first design in the second design;
   performing placement on the changes made to the first design on the second design;
   determining whether the placement on the changes made satisfies timing constraints on the second design; and
   performing incremental routing in response to determining that the placement satisfies the timing constraints.

2. The method of claim 1, wherein identifying the changes comprises determining whether a first node in the first design is equivalent to a second node in the second design.

3. The method of claim 2, wherein determining whether the first node in the first design is equivalent to the second node in the second design comprises determining whether the first and second nodes have similar timing constraints.

4. The method of claim 2, wherein determining whether the first node in the first design is equivalent to the second node in the second design comprises determining whether the first and second nodes have similar placement constraints.

5. The method of claim 2, wherein determining whether the first node in the first design is equivalent to the second node in the second design comprises determining whether the first and second nodes have a similar number of input connections.

6. The method of claim 2, wherein determining whether the first node in the first design is equivalent to the second node in the second design comprises determining whether the first and second nodes have a similar number of outputs.

7. The method of claim 2, wherein determining whether the first node in the first design is equivalent to the second node in the second design comprises determining whether the first and second nodes have matching logic unit table (LUT) masks.

8. The method of claim 2, wherein determining whether the first node in the first design is equivalent to the second node in the second design comprises determining whether the first and second nodes are surrounded by same neighbors.

9. The method of claim 2, wherein determining whether the first node in the first design is equivalent to the second node in the second design comprises determining whether the first and second nodes are of matching type.

10. The method of claim 2, wherein determining whether the first node in the first design is equivalent to the second node in the second design comprises determining whether the first and second nodes have a same name.

11. The method of claim 1, wherein performing placement on the changes made to the first design comprises:
    placing new logic elements (LEs) at preferred locations;
    resolving illegalities in placement of the new LEs.

12. The method of claim 11, wherein resolving illegalities in the placement of the new LEs comprises:
    generating proposed moves for an LE;

generating cost function values for a current placement and placements with the proposed moves; and accepting a proposed move if its associated cost function value is better than the cost function value for the current placement.

13. The method of claim 12, wherein generating the proposed moves comprises moving the LE to a logic-array block (LAB) that is a fanin of the LE.

14. The method of claim 12, wherein generating the proposed moves comprises moving the LE to a logic-array block (LAB) that is a fanout of the LE.

15. The method of claim 12, wherein generating the proposed moves comprises moving the LE to a logic-array block (LAB) that is a sibling of a LAB where the LE resides.

16. The method of claim 12, wherein generating the proposed moves comprises moving the LE to a logic-array block (LAB) that is adjacent to the LE.

17. The method of claim 12, wherein generating the proposed moves comprises moving the LE to any random free LE.

18. The method of claim 12, wherein generating the proposed moves comprises moving the LE in a direction of a critical vector.

19. The method of claim 12, wherein generating the cost function values comprises computing values using cluster legality as a parameter.

20. The method of claim 11, further comprising:
determining whether placement on the identified changes made to the first design satisfies timing constraints; and
performing logic array block and logic element moves if the timing constraints are not satisfied.

21. The method of claim 1, further comprising utilizing placement information of nodes in the first design that have not changed in the second design.

22. The method of claim 1, wherein determining whether the placement on the changes made satisfies timing constraints comprises performing timing analysis on the placement of the system.

23. The method of claim 1, wherein performing incremental routing comprises utilizing routing resources identified for a first node in the first design for an equivalent second node in the second design having equivalent sources and destinations.

24. The method of claim 1, wherein performing incremental routing comprises utilizing routing resources identified for a first node in the first design for an equivalent second node in the second design having equivalent sources and destinations when valid routing can be performed.

25. A method for designing a system on a target device utilizing field programmable gate arrays (FPGAs) comprising:
identifying changes made to a first design in a second design by determining whether a first node in the first design is equivalent to a second node in the second design by comparing timing constraints of the first and second nodes;
performing placement on the changes made to the first design in the second design; and
utilizing placement information from the first design for nodes that have not changed in the second design.

26. The method of claim 25, wherein identifying the changes further comprises comparing placement constraints on the first and second nodes.

27. The method of claim 25, further comprising performing incremental routing in response to determining that the placement satisfies timing constraints of the second design.

28. The method of claim 27, wherein performing incremental routing comprises utilizing routing resources identified for a first node in the first design for an equivalent second node in the second design having equivalent sources and destinations.

29. A machine-readable medium having stored thereon sequences of instructions, the sequences of instructions including instructions which, when executed by a processor, causes the processor to perform:
generating a first design for a system that includes a first netlist describing a first logical design, and placement and routing of the first logical design;
generating a second design for the system that includes a second netlist describing a second logical design;
identifying changes made to the first design in the second design by determining whether a first node in the first design is equivalent to a second node in the second design by determining whether the first and second nodes have matching logic unit table (LUT) masks that are bit strings that represent truth tables for functions; and
performing placement on the changes made to the first design on the second design.

30. The machine-readable medium of claim 29, further including sequences of instructions that when executed by the processor causes to processor to perform utilizing placement information from the first design for nodes that have not changed in the second design.

31. The machine-readable medium of claim 29, further comprising performing incremental routing in response to determining that the placement satisfies timing constraints of the second design.

32. The machine-readable medium of claim 31, wherein performing incremental routing comprises utilizing routing resources identified for a first node in the first design for an equivalent second node in the second design having equivalent sources and destinations.

* * * * *